(12) United States Patent
Huang

(10) Patent No.: US 12,468,092 B2
(45) Date of Patent: Nov. 11, 2025

(54) HEAT DISSIPATION STRUCTURE OF OPTICAL TRANSCEIVER AND OPTICAL TRANSCEIVER

(71) Applicant: CLOUD LIGHT TECHNOLOGY LIMITED, Hong Kong (HK)

(72) Inventor: Chieh-Tse Huang, Hong Kong (HK)

(73) Assignee: Lumentum Operations LLC, San Jose, CA (US)

( * ) Notice: Subject to any disclaimer, the term of this patent is extended or adjusted under 35 U.S.C. 154(b) by 212 days.

(21) Appl. No.: 18/119,292

(22) Filed: Mar. 9, 2023

(65) Prior Publication Data
US 2024/0302599 A1    Sep. 12, 2024

(51) Int. Cl.
*G02B 6/38* (2006.01)
*H05K 7/20* (2006.01)

(52) U.S. Cl.
CPC ......... *G02B 6/3814* (2013.01); *H05K 7/2049* (2013.01)

(58) Field of Classification Search
CPC ...... G02B 6/42; G02B 6/4269; G02B 6/3814; H05K 7/2049
USPC ......................................................... 361/715
See application file for complete search history.

(56) References Cited

U.S. PATENT DOCUMENTS

| | | | | |
|---|---|---|---|---|
| 5,937,517 | A * | 8/1999 | Smith | B23P 15/26 257/E23.105 |
| 6,009,938 | A * | 1/2000 | Smith | H01L 23/3672 257/722 |
| 11,275,223 | B1 * | 3/2022 | Lin | G02B 6/4246 |
| 2018/0368283 | A1 * | 12/2018 | Little | H01R 13/6581 |
| 2022/0099903 | A1 * | 3/2022 | Tsai | G02B 6/4292 |

FOREIGN PATENT DOCUMENTS

| | | | | |
|---|---|---|---|---|
| CN | 210605102 U | * | 5/2020 | |
| CN | 111416234 A | * | 7/2020 | G02B 6/4261 |
| CN | 212677628 U | * | 3/2021 | F28F 1/14 |
| CN | 113448027 A | * | 9/2021 | G02B 6/4269 |
| CN | 217010868 U | * | 7/2022 | |

* cited by examiner

*Primary Examiner* — Jayprakash N Gandhi
*Assistant Examiner* — Kyle Oxenknecht
(74) *Attorney, Agent, or Firm* — Harrity & Harrity, LLP

(57) ABSTRACT

A heat dissipation structure of an optical transceiver includes a housing, a frame, a uniform heat component, an outer fin and an elastic clamping component. The housing has an accommodating space, extends along a lengthwise direction, and is divided into an exposed section and a hidden section in the lengthwise direction. The part of the uniform heat component corresponding to the hidden section is embedded in the accommodating space. The heat conductive block is disposed in the accommodating space and is in thermal contact with the uniform heat component. The outer fin is disposed at the exposed section and is in thermal contact with the uniform heat component. The elastic clamping component clamps both sides of the outer fin in a widthwise direction, and has a pushing member in a lengthwise direction, wherein the pushing member pushes the frame to move the outer fin inward along the lengthwise direction.

20 Claims, 4 Drawing Sheets

HEAT DISSIPATION STRUCTURE OF OPTICAL TRANSCEIVER AND OPTICAL TRANSCEIVER

BACKGROUND OF THE INVENTION

1. Field of the Invention

The present application relates to a heat dissipation structure, and in particular to a heat dissipation structure of an optical transceiver and an optical transceiver having the heat dissipation structure.

2. Description of the Related Art

An optical transceiver is a device that converts light signals into electrical signals or electrical signals into light signals. During the conversion, the operating temperature of optoelectronic elements is quite high, and heat energy needs to be rapidly dissipated in order to achieve stable operations. However, due to closed nature of the optical transceiver and the optical transceiver is frequently embedded in a machine or device, heat dissipation of the optical transceiver is made quite challenging. Even if cooling fins are added to the optical transceiver, heat energy can only disperse within a limited space of the machine and may not be effectively dissipated.

BRIEF SUMMARY OF THE INVENTION

Therefore, in order to solve various heat dissipation issues of a conventional optical transceiver, the present application provides a heat dissipation structure of an optical transceiver and an optical transceiver.

To achieve the above and other objects, the present application provides a heat dissipation structure of an optical transceiver. The heat dissipation structure includes: a housing, having an accommodating space, the housing extending along a lengthwise direction and divided into an exposed section and a hidden section in the lengthwise direction; a frame, fitted with the exposed section and the hidden section, the frame provided with an opening at a position corresponding to each of the exposed section and the hidden section; a uniform heat component, extending along the lengthwise direction and fitted with the openings, wherein the part of the uniform heat component corresponding to the hidden section is embedded in the accommodating space; an outer fin, disposed at the exposed section and in thermal contact with the uniform heat component; and an elastic clamping component, clamping both sides of the outer fin in a widthwise direction perpendicular to the lengthwise direction, the elastic clamping component having a pushing member in the lengthwise direction, wherein the pushing member pushes the frame to move the outer fin inward along the lengthwise direction.

In one embodiment of the present application, at least one side of the frame is provided with a limiting protrusion, and the elastic clamping component is correspondingly provided with a limiting recess. The limiting protrusion is accommodated in the limiting recess, and a length of the limiting recess in the lengthwise direction is greater than a length of the limiting protrusion in the lengthwise direction.

In one embodiment of the present application, a surface of the part of the uniform heat component corresponding to the exposed section has a plurality of projecting features, which coordinate with the outer fin to form a plurality of airflow passages.

In one embodiment of the present application, the dissipation structure of an optical transceiver further includes at least one heat conductive block, which is disposed in the accommodating space and is in thermal contact with the uniform heat component.

In one embodiment of the present application, the dissipation structure of an optical transceiver further includes a heat conductive plate, which is disposed on a surface of the hidden section and is in thermal contact with the uniform heat component.

In one embodiment of the present application, the dissipation structure of an optical transceiver further includes an inner fin, which is thermal contact with the heat conductive plate.

In one embodiment of the present application, the uniform heat component is a vapor chamber.

In one embodiment of the present application, the dissipation structure of an optical transceiver further includes a box which is accommodated in the hidden section, wherein a partition plate of the box separates the hidden section and the exposed section.

The present application further provides an optical transceiver including: the above heat dissipation structure of an optical transceiver; and an optoelectronic conversion module, disposed in the accommodating space.

In one embodiment of the present application, a surface of the uniform heat component corresponding to a heat generating element of the optoelectronic conversion module has a plurality of projecting features, which are in close contact with the heat generating element.

Thus, with the arrangement of the uniform heat component extending to the exposed section, the heat dissipation structure of an optical transceiver and the optical transceiver of the present application are capable of further carrying heat energy in the accommodating space by airflows in an outer space of the exposed section, so that heat dissipation of heat energy is no longer limited to only inside and outside of the hidden section. Moreover, by clamping and pushing the outer fin with the elastic clamping component, the outer fin is enabled to be in close contact at a flexible margin with the partition plate of the box, allowing airflows to smoothly dissipate heat along a fin direction of the outer fin, thereby effectively reducing the operating temperature of the optoelectronic conversion module to achieve a rapid cooling effect as well as enhancing safety and reliability of the optoelectronic conversion module.

DETAILED DESCRIPTION OF THE INVENTION

To fully understand the present application, the present application is described in detail by way of specific embodiments with the accompanying drawings below. A person skilled in the art would be able to understand the objects, features and effects of the present application on the basis of the application of the present application. It should be noted that, the present application may be implemented or applied by other specific embodiments, and changes and modifications may also be made on the basis of different perspectives and applications to various details in the description without departing from the spirit of the present application. Technical contents associated with the present application are described in detail below, and it should be noted that the application is not to be construed as limitations to the scope of claims of the present application. Associated details are as given in the description below.

Figure 1:
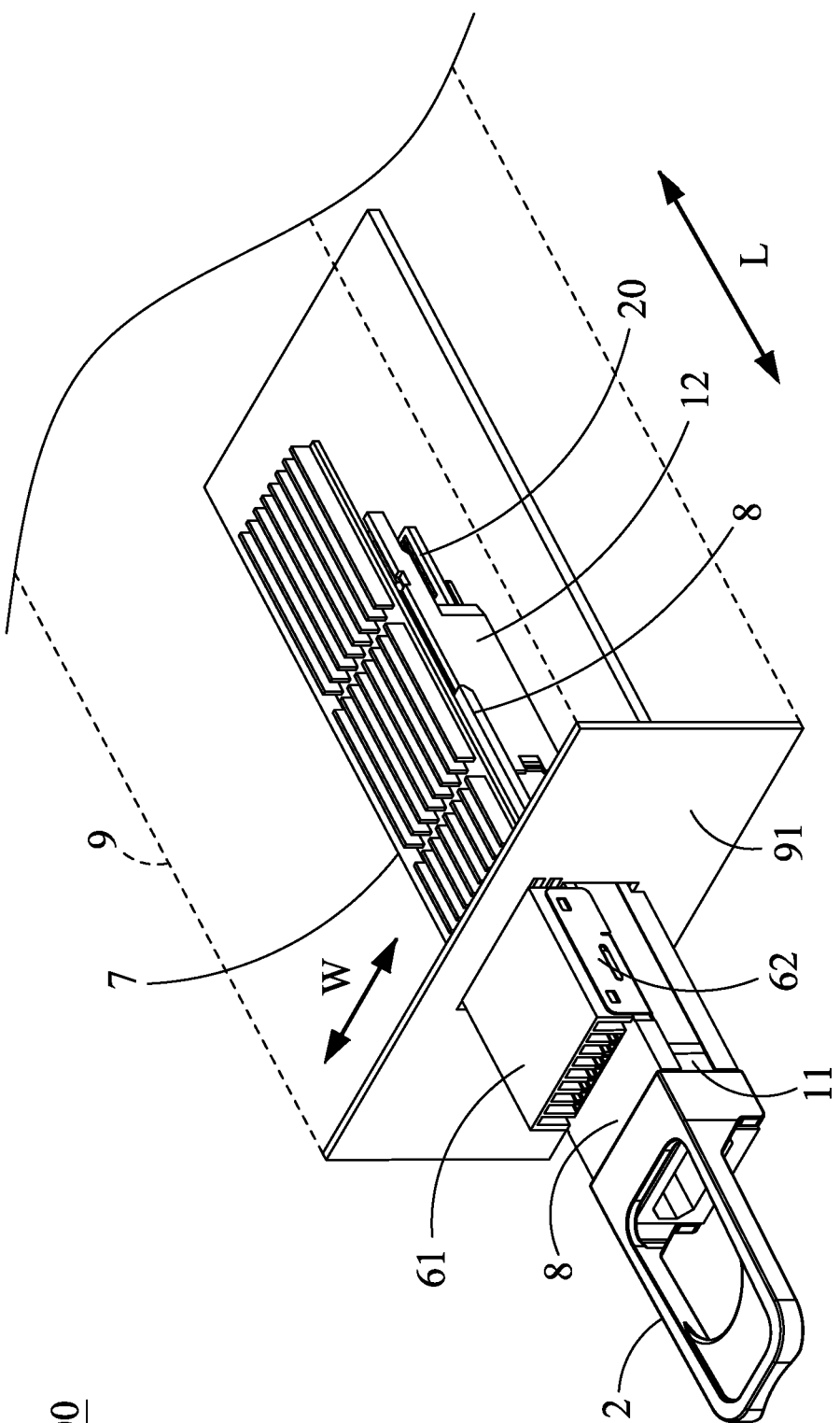
FIG. 1 is a perspective schematic diagram of an optical transceiver according to an embodiment of the present application.
Figure 2:
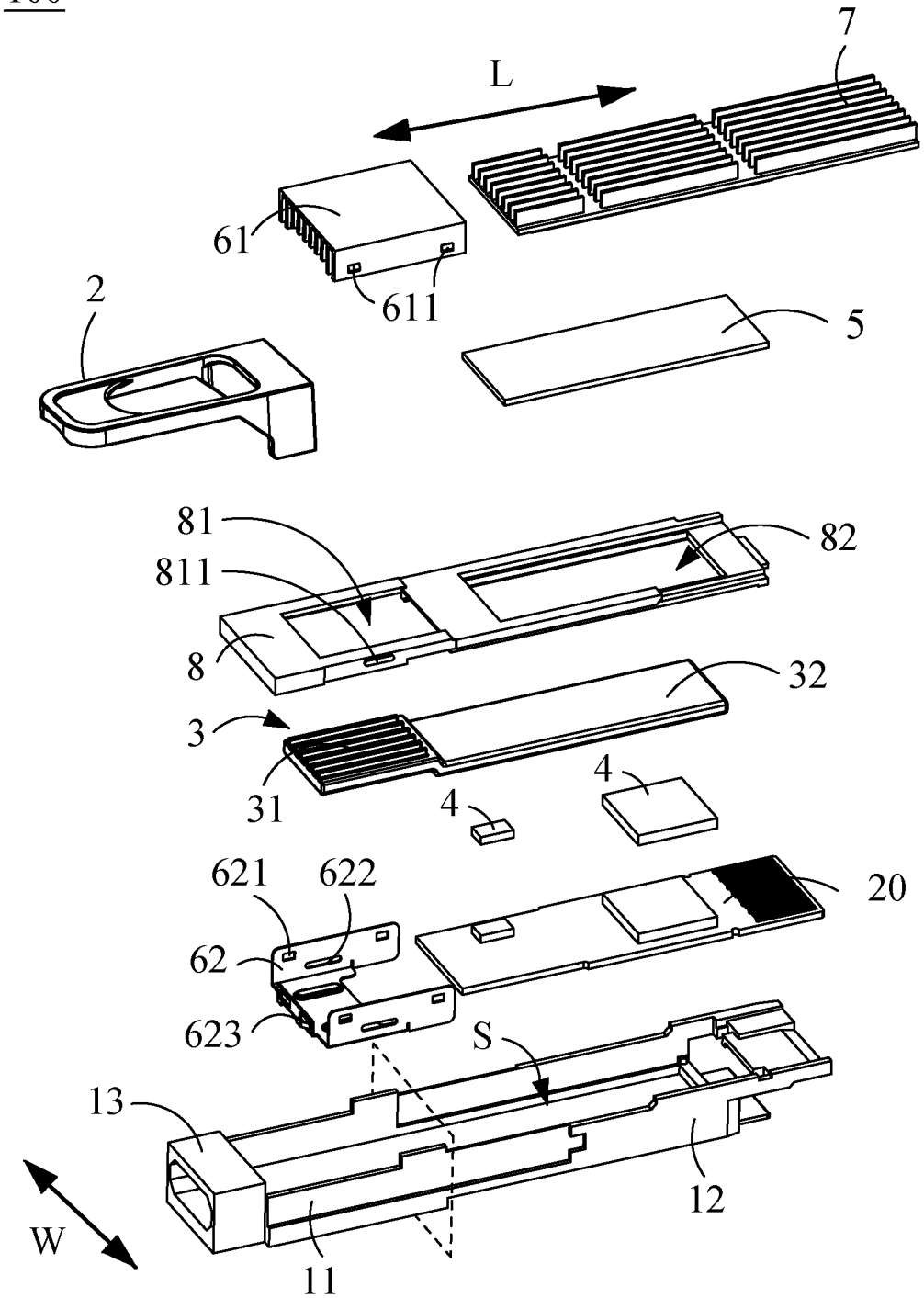
FIG. 2 is an exploded diagram of a heat dissipation structure of an optical transceiver according to an embodiment of the present application.

As shown in FIG. 1 and FIG. 2, an optical transceiver 200 according to an embodiment of the present application includes a heat dissipation structure 100 and an optoelectronic conversion module 20.

The optical transceiver 200 converts, by the optoelectronic conversion module 20, light signals from the outside into electrical signals or electrical signals into light signals, which are then transmitted. In this embodiment, the optoelectronic conversion module 20 includes a circuit board and two optical interfaces. The optical interfaces may be a transmitter optical interface (which may be connected to a photodiode) and a receiver optical interface (which may be connected to a vertical cavity surface emitting laser (VCSEL)). The transmitter optical interface and the receiver optical interface are individually signally connected to the circuit board, and are respectively connected to optical fibers (not shown). The circuit board extends to a back-end, and may be signally connected to another device so as to receive or transmit signals. However, it should be noted that the present application is not limited to the examples above. In other examples, the optical interface may include only a transmitter optical interface or a receiver optical interface to only convert light signals into electrical signal or to only convert electrical signals into light signals.

The heat dissipation structure 100 of the optical transceiver 200 includes a housing 1, a frame 8, a uniform heat component 3, an outer fin 61 and an elastic clamping component 62.

The housing 1 has an accommodating space S. The housing 1 extends along a lengthwise direction L and is divided into an exposed section 11 and a hidden section 12 in the lengthwise direction L. The exposed section 11 and the hidden section 12 are divided by a machine or a device accommodating the optical transceiver 200. The part of the housing 1 exposed outside the machine or the device and used to receive an external optical fiber connector (not shown) is the exposed section 11, and in contrast, the part of the housing 1 inserted into the machine or the device or enclosed and hidden is the hidden section 12. The external optical connector may be inserted into the housing 1 from the exposed section 11 so as to accommodate and fix the optical fiber connector. The optoelectronic conversion module 20 is disposed in the accommodating space S, and light emitted by the optical fiber connector optically couples with the optoelectronic conversion module 20 in the accommodating space S.

The hidden section 12 is constantly hidden and accommodated in an enclosed box 9, the exposed section 11 is exposed outside the box 9, and a partition plate 91 of the box 9 separates the hidden section 12 and the exposed section 11. That is, only the exposed section 11 is exposed on the outside in order to be plugged with the optical fiber connector, and the hidden section 12 and the optoelectronic conversion module 20 hidden in the hidden section 12 are enclosed and protected by the box 9 to be protected from external contamination or impact by external forces.

As shown in FIG. 2, the frame 8 is engaged with the exposed section 11 and the hidden section 12, and positions of the frame 8 corresponding to the exposed section 11 and the hidden section 12 are provided with a first opening 81 and a second opening 82, respectively.

As shown in FIG. 2, the uniform heat component 3 extends along the lengthwise direction L. The part of the uniform heat component 3 corresponding to the exposed section 11 (a first part 31) is fitted with the first opening 81, and the part of the uniform heat component 3 corresponding to the hidden section 12 (a second part 32) is fitted with the second opening 82. That is to say, the frame 8 fixedly mounts the uniform heat component 3 at the exposed section 11 and the hidden section 12. The part of the uniform heat component 3 corresponding to the hidden section 12 (the second part 32) is disposed in the accommodating space S. In this embodiment, the uniform heat component 3 is preferably a vapor chamber, which is a vacuum chamber with microstructures on inner walls. A working fluid in the cavity absorbs heat energy of a heat source and evaporates, and becomes condensed once flown to a cooler area so as to release the heat energy. The condensed working fluid returns to the heat source by means of capillarity of micro-structures. The above process cyclically repeats in the cavity. However, in other embodiments, the uniform heat component 3 may also be a heat pipe. Compared to a vapor chamber that dissipate heat in a two-dimensional manner, the heat pipe rapidly dissipates heat in a one-dimensional manner.

With the arrangement of the uniform heat component 3 extending to the exposed section 11, heat energy in the accommodating space S can be carried away by airflows in an outer space of the exposed section 11, so that heat dissipation of heat energy is no longer limited to only inside and outside of the hidden section 12.

As shown in FIG. 1 to FIG. 3B, the outer in 61 is disposed at the exposed section 11 and is in thermal contact with the first part 31 of the uniform heat component 3. The outer fin 61 is preferably in a material (for example, copper) having good heat conductivity, a bottom surface of the outer fin 61 is in thermal contact with the first part 31 of the uniform heat component 3, and the other part has a high surface area so as to provide external heat dissipation.

As shown in FIG. 1 to FIG. 3C, the elastic clamping component 62 clamps both sides of the outer fin 61 in a widthwise direction W, wherein the widthwise direction W is perpendicular to the lengthwise direction L. In this embodiment, at least one protrusion 611 is provided on each of both sides of the outer fin 61 in the widthwise direction W, and the elastic clamping component 62 has fasteners 621 at corresponding positions, wherein the fasteners 621 are fastened with the protrusions 611 to enable the elastic clamping component 62 to clamp the both sides of the outer fin 61. However, it should be noted that the present application is not limited to the examples above, and the elastic clamping component 62 may clamp the both sides of the outer fin 61 in the widthwise direction W by using other structural forms.

Figure 3A:
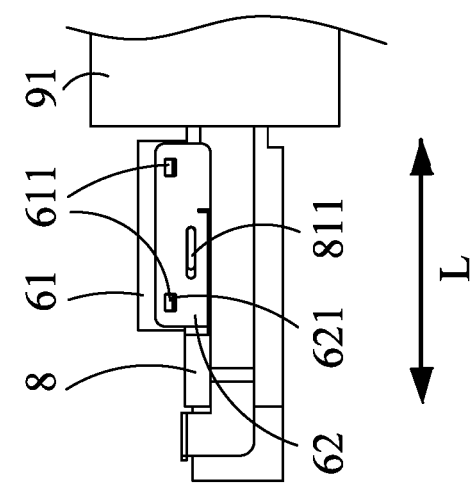
FIG. 3A is a first schematic diagram of pushing of an elastic clamping component according to an embodiment of the present application, with a handle omitted from the drawing.
Figure 3B:
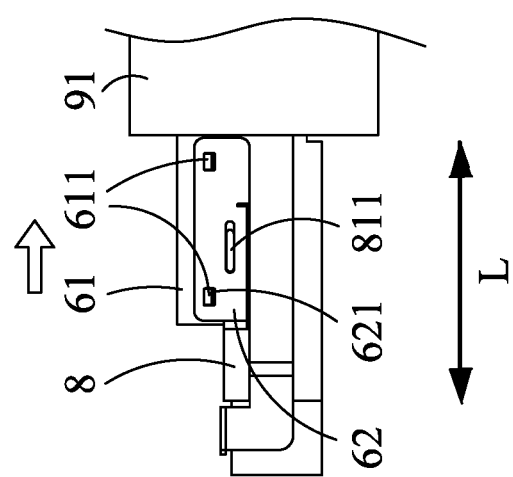
FIG. 3B is a second schematic diagram of pushing of an elastic clamping component according to an embodiment of the present application, with a handle omitted from the drawing.
Figure 3C:
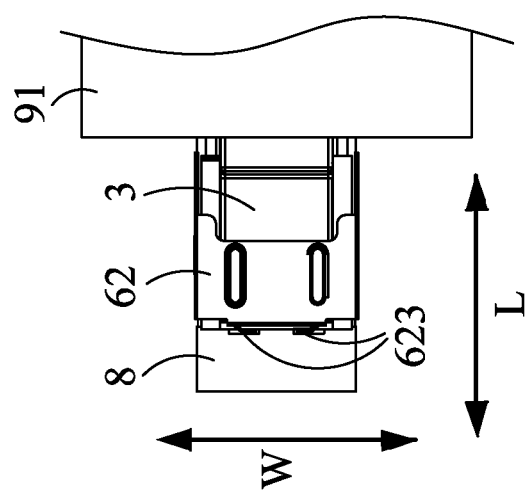
FIG. 3C is a bottom view of an elastic clamping component according to an embodiment of the present application, with a handle omitted from the drawing.

As shown in FIG. 3C, the elastic clamping component 62 further has a pushing element 623 in the lengthwise direction L. The pushing member 623 pushes the frame 8 so as to move the outer fin 61 inward along the lengthwise direction L. More specifically, the pushing member 623 is, for example, an elastic piece and may be a metal elastic piece or an injection molded plastic piece with elasticity. One end of the pushing member 623 pushes against the frame 8, and the other end is connected to a body of the elastic clamping component 62 such that the elastic clamping component 62 has an inward pushing force (toward the partition plate 91 of the box 9) in the lengthwise direction L. As shown in FIG. 3A, when the outer fin 61 and the partition plate 91 have a gap in between (which may be possibly resulted by a manufacturing or assembly tolerance), the pushing force generated by the pushing member 623 enables the elastic clamping component 62 to clamp and push the outer fin 61 toward the partition plate 91 (as shown in FIG. 3B), such that the outer fin 61 is in close contact with the partition plate 91 to eliminate the gap. When there is no longer the gap between the outer fin 61 and the partition plate 91, airflows can then smoothly dissipate heat along the fin direction of the outer fin 61. Otherwise, when the outer fin 61 and the partition plate 91 have the gap in between, turbulent flows are formed around the gap to disrupt the flow direction of the airflows of the outer fin 61 and hence lower the heat dissipation efficiency.

Thus, by means of eliminating the gap between the outer fin 61 and the partition plate 91 in an elastic manner, the heat dissipation structure 100 of an optical transceiver effectively reduces the operating temperature of the optoelectronic conversion module 20, achieving a rapid cooling effect as well as enhancing safety and reliability of the optoelectronic conversion module 20.

Further, in this embodiment, as shown in FIG. 1 to FIG. 3B, at least one side of the frame 8 is provided with a limiting protrusion 811, and the elastic clamping component 62 is correspondingly provided with a limiting recess 622. The limiting protrusion 811 is accommodated in the limiting recess 622, and the length of the limiting recess 622 in the lengthwise direction L is greater than the length of the limiting protrusion 811 in the lengthwise direction L. That is to say, the limiting protrusion 811 and the limiting recess 622 are capable of relative movement, and under the premise of keeping the frame 8 unmoved, a largest movable range of the elastic clamping component 62 is limited by the design of the limiting protrusion 811 and the limiting recess 622. In other words, the limiting protrusion 811 attends both limiting and guidance functions.

Figure 4:
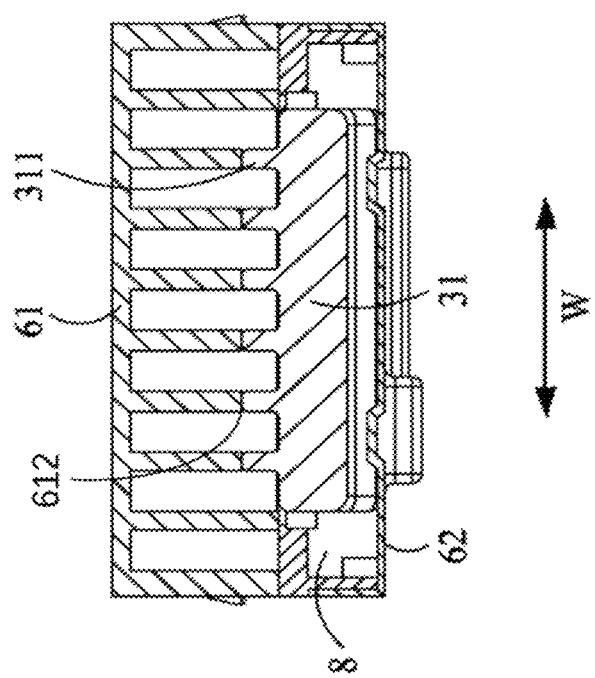
FIG. 4 is a section schematic diagram of a heat dissipation structure of an optical transceiver according to an embodiment of the present application.

Further, in this embodiment, as shown in FIG. 4, a surface of the first part 31 of the uniform heat component 3 corresponding to the exposed section 11 has a plurality of projecting features 311, which coordinate with the outer fin 61 to form a plurality of airflow passages. Due to the characteristics of the uniform heat component 3, the uniform heat component 3 has better heat conductivity and heat dissipation ability compared to the outer fin 61. Thus, the projecting features 311 on the surface of the uniform heat component 3 equivalently replace a part of the outer fin 61, further improving the heat dissipation ability. The alignment between the projecting features 311 and the fin tips 612 of the outer fin 61 may be implemented by a simple adhesion or assembly, or be only contacting each other.

Further, in this embodiment, as shown in FIG. 2, the heat dissipation structure 100 further includes a heat conductive block 4 (for example, a heat sink), which is disposed in the accommodating space S and is in thermal contact with the uniform heat component 3 and the optoelectronic conversion module 20. Preferably, the number of the heat conductive block 4 corresponds to the number of heat generating elements on the optoelectronic conversion module 20, or at least the number is one so as to rapidly transfer heat energy of a heat source to the uniform heat component 3. In this embodiment, the heat conductive block 4 and the uniform heat component 3 are separate components, and the heat conductive block 4 is used to eliminate height differences of the heat generating elements and allow the uniform heat component 3 to absorb and uniformly transfer heat energy of multiple heat sources with different heating powers; however, the present application is not limited to the examples above. In other examples, the heat conductive block 4 and the uniform heat component 3 may be integrated into an integral structure; that is, the uniform heat component 3 is made as a stepped structure with blocks so as to match with the heights of the heat generating elements and be close to the heat generating elements. For example, a surface of the uniform heat component 3 corresponding to the heat generating elements of the optoelectronic conversion module 20 has projecting features, which are in close contact with the heat generating elements so as to form a plurality of heat dissipation paths.

Further, in this embodiment, the heat dissipation structure 100 further includes a heat conductive plate 5 (for example, a heat spreader), which is disposed on a surface of the hidden section 12 and is in thermal contact with the uniform heat component 3. The heat conductive plate 5 is a rectangular block having undergone precision processing and similarly has outstanding heat conductivity (for example, in a copper material). Moreover, the heat conductive plate 5 has a roughness that needs to be controlled to be within Ra 0.8 to 1.6 μm and a levelness that needs to be controlled to be within 0.050 to 0.075 mm, so as to be better coupled with an inner fin 7. That is to say, the heat conductive plate 5 is a continuous and high-precision complete plane, and a contact area thereof with the inner fin 7 is ensured to be greater than 39.2 mm*13 mm, so that the thermal contact area is maximized to meet the product specification of a quad small form-factor pluggable (QSFP) optical module.

In this embodiment, the part of the uniform heat component 3 corresponding to the exposed section 11 (the first part 31) is disposed on an upper surface 13 of the exposed section 11 (the upper surface 13 is partially hollow for the arrangement of the uniform heat component 3), and the heat conductive plate 5 is disposed on an upper surface of the hidden section 12 (the upper surface of the hidden section 12 is hollow for the arrangement of the heat conductive plate 5). Thus, the hidden section 12 may be further mounted with the inner fin 7 that is in thermal contact with the heat conductive plate 5. The inner fin 7 is made of a material similarly having good heat conductivity, a bottom surface of the inner fin 7 is in thermal contact with the heat conductive plate 5, and the other part has a high surface area for heat dissipation.

Further, as shown in FIG. 1 and FIG. 2, in this embodiment, the heat dissipation structure 100 further includes a handle 2, of which one end is connected to the housing 1 and the other end extends outward along the lengthwise direction L. The handle 2 allows holding of a user so as to pull out the entire housing 1 in the lengthwise direction L.

The present invention is described by way of the embodiments above. A person skilled in the art should understand that, these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A heat dissipation structure of an optical transceiver, comprising:
    a housing, having an accommodating space, the housing extending along a lengthwise direction and divided into an exposed section and a hidden section in the lengthwise direction;
    a frame, fitted with the exposed section and the hidden section, the frame defining an exposed opening at a location corresponding to the exposed section and a hidden opening at a location corresponding to the hidden section;
    a uniform heat component, extending along the lengthwise direction and in contact with a bottom surface of the frame,
        wherein an exposed part of the uniform heat component is fitted within the exposed opening,
        wherein the exposed part comprises a plurality of projecting features, and
        wherein a hidden part of the uniform heat component extends beneath the hidden opening;
    an outer fin, disposed at the exposed section and in thermal contact with the uniform heat component via a plurality of fins,
        wherein a fin, of the plurality of fins, has a fin tip that is in contact with a projecting tip of a projecting feature of the plurality of projecting features, and
        wherein the plurality of fins coordinate with the plurality of projecting features to form a plurality of airflow passages in the lengthwise direction; and
    an elastic clamping component, clamping both sides of the outer fin in a widthwise direction which is perpendicular to the lengthwise direction, the elastic clamping component having a pushing member in the lengthwise direction, wherein the pushing member pushes the frame to move the outer fin inward along the lengthwise direction.

2. The heat dissipation structure of an optical transceiver according to claim 1, wherein at least one side of the frame is provided with a limiting protrusion, the elastic clamping component is correspondingly provided with a limiting recess, the limiting protrusion is accommodated in the limiting recess, and a length of the limiting recess in the lengthwise direction is greater than a length of the limiting protrusion in the lengthwise direction.

3. The heat dissipation structure of an optical transceiver according to claim 1, further comprising at least one heat conductive block, which is disposed in the accommodating space and is in thermal contact with the uniform heat component.

4. The heat dissipation structure of an optical transceiver according to claim 1, further comprising at least one heat conductive plate, which is disposed within the hidden opening and in thermal contact with the hidden part of the uniform heat component.

5. The heat dissipation structure of an optical transceiver according to claim 4, further comprising an inner fin which is in thermal contact with the heat conductive plate.

6. The heat dissipation structure of an optical transceiver according to claim 1, further comprising a partition plate that separates the hidden section and the exposed section.

7. The heat dissipation structure of an optical transceiver according to claim 6, wherein the plurality of fins are in contact with the partition plate.

8. The heat dissipation structure of an optical transceiver according to claim 1, further comprising:
    an optoelectronic conversion module, disposed in the accommodating space.

9. The heat dissipation structure of an optical transceiver according to claim 1, wherein the outer fin is configured to be slidably engaged with the exposed part of the uniform heat component.

10. The heat dissipation structure of an optical transceiver according to claim 1, wherein the uniform heat component is arranged to extend into the exposed section beyond a position for receiving a circuit board.

11. A heat dissipation structure, comprising:
    a housing defining an accommodating space, the housing extending along a lengthwise direction and divided into an exposed section and a hidden section in the lengthwise direction;
    a frame, fitted with the exposed section and the hidden section, the frame defining an exposed opening at a location corresponding to the exposed section and a hidden opening at a location corresponding to the hidden section;
    a uniform heat component, extending along the lengthwise direction and in contact with a bottom surface of the frame,
        wherein an exposed part of the uniform heat component is fitted within the exposed opening, and
        wherein the exposed part comprises a plurality of projecting features; and
    an outer fin component, disposed at the exposed section and in thermal contact with the uniform heat component via a plurality of fins,
        wherein a fin, of the plurality of fins, has a fin tip that is in contact with a projecting tip of a projecting feature of the plurality of projecting features, and
        wherein the plurality of fins coordinate with the plurality of projecting features to form a plurality of airflow passages in the lengthwise direction.

12. The heat dissipation structure of claim 11, further comprising:
    an elastic clamping component, clamping both sides of the outer fin component in a widthwise direction which is perpendicular to the lengthwise direction, the elastic clamping component having a pushing member in the lengthwise direction, wherein the pushing member pushes the frame to move the outer fin component inward along the lengthwise direction.

13. The heat dissipation structure of claim 12, wherein at least one side of the frame is provided with a limiting protrusion, the elastic clamping component is correspondingly provided with a limiting recess, the limiting protrusion is accommodated in the limiting recess, and a length of the limiting recess in the lengthwise direction is greater than a length of the limiting protrusion in the lengthwise direction.

14. The heat dissipation structure of claim 11, further comprising at least one heat conductive block, which is disposed in the accommodating space and is in thermal contact with the uniform heat component.

15. The heat dissipation structure of claim 11, further comprising at least one heat conductive plate, which is disposed within the hidden opening and in thermal contact with a hidden part of the uniform heat component.

16. The heat dissipation structure of an optical transceiver according to claim 15, further comprising an inner fin which is in thermal contact with the heat conductive plate.

17. The heat dissipation structure of claim 11, wherein the outer fin component is configured to be slidably engaged with the exposed part of the uniform heat component.

18. The heat dissipation structure of claim 11, wherein the uniform heat component is arranged to extend into the exposed section beyond a position for receiving a circuit board.

19. The heat dissipation structure of claim 11, further comprising a partition plate that separates the hidden section and the exposed section.

20. The heat dissipation structure of claim 19, wherein the plurality of fins are in contact with the partition plate.

* * * * *